United States Patent
Law et al.

(10) Patent No.: US 8,589,847 B2
(45) Date of Patent: *Nov. 19, 2013

(54) CIRCUITS AND METHODS FOR PROGRAMMABLE TRANSISTOR ARRAY

(71) Applicant: Taiwan Semiconductor Manufacturing Company, Ltd., Hsin-Chu (TW)

(72) Inventors: Oscar M. K. Law, Hsin-Chu (TW); Kuo H. Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/674,800

(22) Filed: Nov. 12, 2012

(65) Prior Publication Data

US 2013/0088259 A1     Apr. 11, 2013

Related U.S. Application Data

(62) Division of application No. 12/605,209, filed on Oct. 23, 2009, now Pat. No. 8,332,794.

(51) Int. Cl.
*G06F 17/50*     (2006.01)
(52) U.S. Cl.
USPC ........... 716/116; 716/100; 716/101; 716/104; 716/121; 716/128
(58) Field of Classification Search
USPC ......... 716/100, 101, 104, 116, 118, 119, 121, 716/128
See application file for complete search history.

(56) References Cited

U.S. PATENT DOCUMENTS

| | | | |
|---|---|---|---|
| 5,528,177 A | 6/1996 | Sridhar et al. | |
| 5,555,201 A | 9/1996 | Dangelo et al. | |
| 6,286,128 B1 | 9/2001 | Pileggi et al. | |
| 6,795,952 B1 * | 9/2004 | Stine et al. | 716/56 |
| 7,039,882 B2 | 5/2006 | Rana et al. | |
| 7,107,566 B1 | 9/2006 | McElheny | |
| 7,196,378 B2 * | 3/2007 | Ichikawa | 257/357 |
| 7,360,198 B2 | 4/2008 | Rana et al. | |
| 7,525,173 B2 * | 4/2009 | Yang et al. | 257/506 |
| 7,675,124 B2 * | 3/2010 | Liaw | 257/390 |
| 7,889,540 B2 * | 2/2011 | Asayama | 365/154 |
| 8,332,794 B2 * | 12/2012 | Law et al. | 716/116 |
| 2010/0244142 A1 * | 9/2010 | Katakura | 257/369 |

OTHER PUBLICATIONS

Pons et al.,"VCTA: A Via-Configurable Transistor Array Regular Fabric", Sep. 2010, 18th IEEE/IFIP VSLI System on Chip Conference, Conference Publications, pp. 335-340.*

* cited by examiner

*Primary Examiner* — Sun Lin
(74) *Attorney, Agent, or Firm* — Slater & Matsil, L.L.P.

(57) ABSTRACT

A programmable transistor array circuit is disclosed comprising a semiconductor substrate; and a plurality of basic transistor units (BTUs) arranged in rows and columns of uniformly spaced cells, the BTUs further comprising PMOS transistor units (PTUs), NMOS transistor units (NTUs) and dummy transistor units (DTUs) each BTU having conductors arranged in a single direction running through the BTUs and the conductors being uniformly spaced with respect to each other. The arrangement of the BTUs is subject to restricted design rules. Logical transistor units (LTUs) are formed from the BTUs using first and second layers of metallization. Additional embodiments are disclosed incorporating the programmable transistor array circuit.

20 Claims, 12 Drawing Sheets

PTA Design Flow

CIRCUITS AND METHODS FOR PROGRAMMABLE TRANSISTOR ARRAY

This application is a divisional of U.S. Pat. No. 8,332,794, issued Dec. 11, 2012, and entitled "Circuits and Methods for Programmable Transistor Array," which is hereby incorporated herein by reference.

TECHNICAL FIELD

The present invention relates to a circuit and methods for providing an improved integrated circuit design and methods for designing an integrated circuit using an array of pre-configured transistors while remaining compatible with existing design methodologies and presently available computer automated design tools.

BACKGROUND

Design of integrated circuits to perform newly identified functions has progressed for many years. Presently, system level designers who determine a need for a newly defined integrated circuit, for example to integrate a variety of functions into one chip, use two primary approaches. In the first known approach, a field programmable gate array (FPGA) is used. In the second known approach, application specific integrated circuit (ASIC) design is used. Each of these prior art approaches has disadvantages which are described in detail below.

FIG. 1 depicts a block diagram view of an application specific integrated circuit (ASIC) or "system on a chip" (SOC) design 100 that may be obtained using current cell based design approaches (CBD). In FIG. 1, an embedded functional module 101, which is a known function such as a microprocessor, RISC processor, analog to digital converter, radio transceiver such as for a mobile telephone or wireless device, or other known function such as a memory module, is incorporated with a plurality of user defined logic units. Another function 102 is also shown, which could be for example embedded memory. Logic cells 104 are shown disposed in rows in partition blocks 105. Routing channels 106 provide connections between the various blocks and logic cells.

FIG. 2 depicts a prior art design flow for performing integrated circuit design using a prior art CBD approach. The steps of FIG. 2 may be performed using electronic design automation (EDA) tools that are commercially available. In the first step, 211, a system design step is performed. System design may be performed using various tools that are commercially available, such as hardware description language (HDL) and VHDL descriptions, known functions may be available as reusable modules licensed by vendors such as processor and DSP modules and referred to as "IP", or callable routines, software modeling may be done in various environments. Typically system design is performed using high level descriptive constructs and simulations are then performed using the EDA tools to verify that the function specified by the behavioral HDL or VHDL model is correct. That is, the simulation verifies the design model in fact gives the right outputs for a given set of inputs or conditions, and that the design described will meet the overall functional requirements. In some cases multiple integrated circuits may be defined in a single system model, in other cases a specific integrated circuit may be defined.

Once the system definition for an integrated circuit is completed, the design flow transitions to a logic synthesis step 213. In automated logic synthesis, the behavioral model is replaced by a functionally equivalent register transistor level (RTL) or logic based model based on certain known functions by EDA synthesis tools. For example, selections between variables in the VHDL model may be replaced by a multiplexer RTL description; storage statements in the VHDL model may be replaced by RTL descriptions of registers or latches, delays may be replaced by delay lines, "add" statements may be replaced by an adder RTL representation, and so forth. The logic synthesis process results in a second description of the device which may then be verified functionally by another simulation and test process, typically using test patterns obtained in the simulations at the system design step.

After the logic synthesis 213 is complete, the device may be described as a netlist of logical functions that are technology independent. The functions may include register transfer language (RTL) or similar register and logic level descriptions including elements such as descriptions of adders, registers, multiplexers and the like. EDIF or other output formats may be provided for the logical level netlist.

Once the technology independent logic model for the cell based design is complete, the technology independent logic level description is again transformed, through the use of standard cell libraries and using technology mapping tools, to a netlist model of technology dependent standard cell or functional modules for known functions. The standard cell approach replaces technology dependent gate level models for the technology independent logical models. Gate loading, drive strength, and other specific parameters that vary with process technology may be considered in making the technology mapping. The new netlist is populated with the proper circuits from a standard cell library to implement the circuit desired in a specific semiconductor process. Once again, a verification process is needed to verify that the technology dependent gate level netlist and the cells and connections used in the gate level model fact are functionally equivalent to the behavioral model.

After the standard cell library is mapped onto the design, the automated design tools can place the elements of the circuit in a proposed circuit placement. A circuit designer may assist with placement based on certain parameters or design needs that the designer is aware of, for example a memory might be placed adjacent the outside of the integrated circuit to make it physically proximate to an external data buss. Alternatively, automatic placement tools may be used as are known in the art.

After placement is complete, the circuit layout process can continue. First, the global routing is performed at step 217. Automated route tools are executed which, using known cost functions based on the length of conductors, number of interconnects, resistance, power and metal migration requirements, and the pre-positioned routing channels provided by the placement tools, the major routing signals are placed, for example power, ground, clock and similar nets are routed in the global route step.

Following the global routing step, additional routing steps 227 and 219 are used to interconnect blocks as specified by the netlist, and detail routing of certain standard cell functions is performed. Following these steps a layout level model of the design is complete. Physical verification step 221 is performed to verify that the transistors and conductors specified are correctly coupled, and that no shorts or opens are formed.

The standard cell design flow ends at step 223 with a Graphic Data Systems II (GDSII) database. The GDSII output specifies graphical data describing the layout of the integrated circuit including the shapes for the transistors, the conductors, and the vias and contacts, etc. The GDSII output is formatted in terms of the individual layers and this data is needed to generate the photomasks to be used. The photomasks are used in a photolithographic semiconductor fabrication process to fabricate a wafer with a plurality of the circuit devices formed upon it. A set of masks for a new SOC may cost over 500,000 dollars to produce. The integrated circuit must then be manufactured from the set of masks in a semiconductor processing facility. Following manufacture of the silicon wafers, tests are run to verify the devices operate, the individual devices may be separated by a singulation step, additional tests performed, and integrated circuit packaging and additional testing of the individual integrated circuits are needed before the completed circuit is available to the customer. This cell based design process of the prior art thus requires expensive non-recurring manufacturing costs for the masks, package design, test pattern generation, and a lengthy turnaround time to get the first ICs completed for system verification.

Standard cell design manufacturing of SOCs or ASICs in the prior art is known to have several disadvantages. The need for a unique set of photomasks for each new IC defined incurs a substantial start up or non recurring engineering (NRE) cost. The use of random placements and routing results in circuit designs that may exhibit very wide process variation sensitivities. The time for producing the first integrated circuits may be very long. The engineering skills needed to design in the cell based design flow may not be present at all companies, as many different EDA tools are used and experience with system level, gate level, physical level integrated circuit layout and physical level design requirements such as packaging is necessary.

FIG. 3 depicts in a block diagram an integrated circuit 200 designed using an FPGA approach. Unlike the SOC CDB approach, for the FPGA approach a completed integrated circuit is provided as base material. The FPGA is configured with existing programmable logic functions and programmable interconnections. Automated design tools are then used to implement the customer design by mapping the design into the FPGA resources and to complete the process by programming functions and interconnections inside the FPGA device. Programming may be accomplished by metal fuses, via programming, non-volatile memory cells, or other means. At the end of the programming step, a completed integrated circuit is immediately available for use; no additional manufacturing time is required.

In FIG. 3 FPGA 200 is depicted. Functional module 201 may be a known complete IP function such as a processor, DSP, or embedded memory module which the FPGA manufacturer has provided. Routing channels 204 are provided with routing conductors already formed in a manner that allows connections between them to be made by interconnect programmation. Logic units 203 are provided in a predefined placement. Logic units 203 may include clocked circuits such as registers, storage elements and the like, as well as configurable logical blocks and other known functions such as multiplexers and buffers. Many rows of the logic units are provided. Initially, the functions of these logic units and the connections of these units are somewhat open. Simple EDA tools are used to create a programmation for the device and the tools are relatively inexpensive.

FIG. 4 depicts an example prior art design flow for designing an integrated circuit using an FPGA approach. Some of the steps in this top down design flow are similar to those in the CBD approach.

System design steps and logic synthesis steps 211 and 213 are similar to those described above and so will not be further described. After a technology independent circuit netlist is obtained, technology mapping step 231 is performed to create a netlist for implementing the design on the target FPGA. The FPGA is already a complete manufactured and packaged integrated circuit, except that the programmable functions and interconnections are yet to be formed, so the technology mapping step must use the available resources on the FPGA to implement the functions in the netlist, and once those are used no more are available. Thus, the EDA tools used may be aware of the resources available in a particular FPGA being used, which is provided by an FPGA definition tool 245.

The global routing step 233 is different from the global routing in the standard cell design flow. The routing conductors are already physically placed as the FPGA is a completed integrated circuit. Only the connections need be completed. Detail routing step 235 for the FPGA design flow does not actually route the conductors, but instead determines which conductors are to be interconnected. Several approaches are known for programming FPGAs. In one anti-fuses or fuses are blown to form connections. In another via programming is used to complete vertical connections between conductors formed overlying one another in different layers. In any case the completed netlist is again subjected to a physical verification step in 237 to ensure proper connections are formed. Finally, a programmation tool forms the completed netlist into the silicon device by programming an FPGA. In this design flow, the end step results in a functional integrated circuit without the need for additional manufacturing steps. The time to get the integrated circuit manufactured and tested is thus saved over the ASIC flow. However, each FPGA circuit must be programmed individually to produce the final design using an appropriate FPGA programming device.

Each of these prior art approaches to designing and producing a new integrated circuit has several disadvantages. Because FPGA devices are supplied as a completed IC with a variety of functions already implemented, and because the programmation blocks require additional circuitry, the devices are very expensive on a per unit basis and are therefore only economically useful at low volumes. Typically FPGA devices are not available at the most advanced technology nodes, for example current FPGA devices are available at the 90 nanometer technology node, while advances in semiconductor processing have moved to 60, 45, and now 32 and 28 nanometer technologies which offer smaller transistors, higher performance and lower power requirements, these advantages are not available to FPGA designers.

The prior art CBD approach has advantages over the FPGA approach in that it provides more flexibility in circuit design, allows access to more advanced semiconductor processes, and has a lower per unit cost in the long term and therefore is more useful for higher volumes. However, the CBD SOC or ASIC approach requires substantial additional expense to create a unique mask set, the cost to manufacture silicon wafers, test pattern development, as well as time and expense for performing packaging and additional tests that are required, and therefore the CBD approach incurs a lengthy delay to get the completed devices. These SOC devices are also known to have great sensitivity to process variations. Further SOC design requires additional design skills to perform that the customer may have to either hire, or purchase from another vendor, adding additional costs. Many companies simply do not have the resources to use this approach.

A continuing need thus exists for a cost effective customer specified integrated circuit design and production, and methods that overcome the disadvantages of the prior art.

SUMMARY OF THE INVENTION

These and other problems are generally solved or circumvented, and technical advantages are generally achieved, by embodiments of the present invention, which provides a programmable transistor array for implementing customer circuit designs in an integrated circuit, and methods for performing the design with fewer manufacturing costs and reduced design time.

In a first exemplary embodiment of the invention, a programmable transistor array is provided comprising a semiconductor substrate; and a plurality of basic transistor units (BTUs) arranged in rows and columns of uniformly spaced cells, the BTUs further comprising PMOS transistor units (PTUs), NMOS transistor units (NTUs) and dummy transistor units (DTUs). In the exemplary embodiment each BTU has conductors arranged in a single direction running through it; the conductors are uniformly spaced with respect to each other. The arrangement of the BTUs may be subject to restricted design rules. For example, the restricted design rules may require that NTUs are adjacent other NTUs and DTUs but not PTUs across the rows, and the PTUs are adjacent other PTUs and DTUs but not DTUs across the rows.

In yet another embodiment, a method for producing an integrated circuit is provided, comprising providing a system design in a high level language description; performing a logic synthesis to produce a technology independent model and netlist from the high level language description; performing a technology mapping to produce a netlist of circuits formed as logic transistor units (LTUs) to replace the technology independent model and netlist; placing the LTUs in an array of rows and columns; routing the LTUs to form a physical model of the netlist; performing LTU placement by forming a first level metallization pattern on basic transistor units (BTUs) arranged to form the LTUs, the BTUs being transistor cells having conductors running in a single direction and gate conductors running in the single direction and having source and drain regions and contacts to couple the gate conductors, conductors, and source and drain regions to the first level of metal. Then the method continues by performing LTU routing forming a second level metallization pattern on the BTUs, the second level of metallization coupling portions of the first level of metal to form circuitry; providing a semiconductor substrate with the BTUs disposed upon it; and forming the first and second levels of metallization to complete the integrated circuit.

In yet another exemplary embodiment, a method for producing an integrated circuit is described, comprising providing a programmable transistor array comprising a plurality of basic transistor units (BTUs) arranged in rows and columns of uniformly spaced cells, the BTUs further comprising PMOS transistor units (PTUs), NMOS transistor units (NTUs) and dummy transistor units (DTUs). Each BTU has conductors arranged in a single direction running through the BTUs and the conductors being uniformly spaced with respect to each other. The arrangement of the BTUs is subject to restricted design rules such that the NTUs are adjacent other NTUs and DTUs but not PTUs across the rows, and the PTUs are adjacent other PTUs and DTUs but not DTUs across the rows. A technology independent circuit and netlist description performing a customer specific system design are provided, a technology mapping to transform the technology independent netlist into a netlist of logical transistor units (LTUs) that may be implemented as a plurality of BTUs is performed. An LTU placement function is performed on the netlist of LTUs by creating a first level metallization pattern coupling certain BTUs to form basic logical elements from the BTUs; and an LTU routing function is performed by creating a second level metallization pattern to couple certain ones of the basic logical elements to form complex circuits within the LTUs. The method continues by routing the LTUs together to form a complete netlist physically implementing the customer specific design; and manufacturing a semiconductor integrated circuit using the complete netlist. The semiconductor integrated circuit has the BTUs arranged in rows and columns disposed on a semiconductor substrate and having first and second metal layers coupling portions of the BTUs together.

In yet another embodiment, a method for producing a multiple die packaged integrated circuit is described, comprising providing a complete integrated circuit die such as a memory device, DSP device, or other completely functioning device, then providing a programmable transistor array (PTA) comprising a plurality of basic transistor units (BTUs) arranged in rows and columns of uniformly spaced cells, the BTUs further comprising PMOS transistor units (PTUs), NMOS transistor units (NTUs) and dummy transistor units (DTUs). Each BTU has conductors arranged in a single direction running through the BTUs and the conductors being uniformly spaced with respect to each other. The arrangement of the BTUs is subject to restricted design rules such that the NTUs are adjacent other NTUs and DTUs but not PTUs across the rows, and the PTUs are adjacent other PTUs and DTUs but not DTUs across the rows. A technology independent circuit and netlist description performing a customer specific system design are provided, a technology mapping to transform the technology independent netlist into a netlist of logical transistor units (LTUs) that may be implemented as a plurality of BTUs is performed. An LTU placement function is performed on the netlist of LTUs by creating a first level metallization pattern coupling certain BTUs to form basic logical elements from the BTUs; and an LTU routing function is performed by creating a second level metallization pattern to couple certain ones of the basic logical elements to form complex circuits within the LTUs. The method continues by routing the LTUs together to form a complete netlist physically implementing the customer specific design; and manufacturing a semiconductor integrated circuit using the complete netlist. The PTA semiconductor integrated circuit has the BTUs arranged in rows and columns disposed on a semiconductor substrate and having first and second metal layers coupling portions of the BTUs together. The two integrated circuits are then physically arranged together in a package. The two integrated circuits may be stacked and coupled using, for example, Multiple Chip Module (MCM), Through Silicon Via (TSVs), wire bonding, ball bonding, BGA, solder column or other multichip packaging technologies to form a single integrated unit in a single package.

The foregoing has outlined rather broadly the features and technical advantages of the present invention in order that the detailed description of the invention that follows may be better understood. This summary section briefly describes certain exemplary embodiments of the invention but the invention is not limited only to these exemplary embodiments.

Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

The drawings, schematics and diagrams are illustrative, not intended to be limiting but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the invention are provided in a programmable transistor array (PTA). By utilizing basic transistor units that are preconfigured and verified, the design and manufacturing processes needed to complete an integrated circuit from a customer provided design are simplified; and turnaround time and manufacturing costs reduced. The PTA embodiments provide basic transistor units that are completely defined through the lower levels of connection. First and second level metallization is then used to complete the logical functions and the interconnections of the transistor units. Vias and higher level metallization layers may be used to complete the routing for the integrated circuit.

In other embodiments described further below, logical units formed of a plurality of basic transistor units may be provided that are preconfigured and the metallization layers may be used to define the functions and to route the interconnections between the functions. Design reusability is supported as known verified logic units may be reused without changing the base layers, and thus the logical units do not require additional verification steps. Processors, embedded memory and other functional units may be provided as part of the programmable transistor array.

In the description of the layouts of embodiments provided below and in the appended claims, certain relative words are used for explanatory purposes, such as "horizontal" and "vertical". It is understood that in the description and in the appended claims these terms are labels of convenience and are arbitrary labels, that is if a device is rotated in orientation, the "horizontal" conductors would become vertical in orientation and the "vertical" conductors would become horizontal in orientation, the position of a device does not change the fact these conductors are organized in parallel in some cases and intersecting in other cases. Further, the illustrations show exemplary examples where the conductors run in only two directions that are generally orthogonal, however, alternative embodiments provide conductors running at other directions one to another and the claims and the invention are not limited to orthogonal arrangements.

Figure 1:
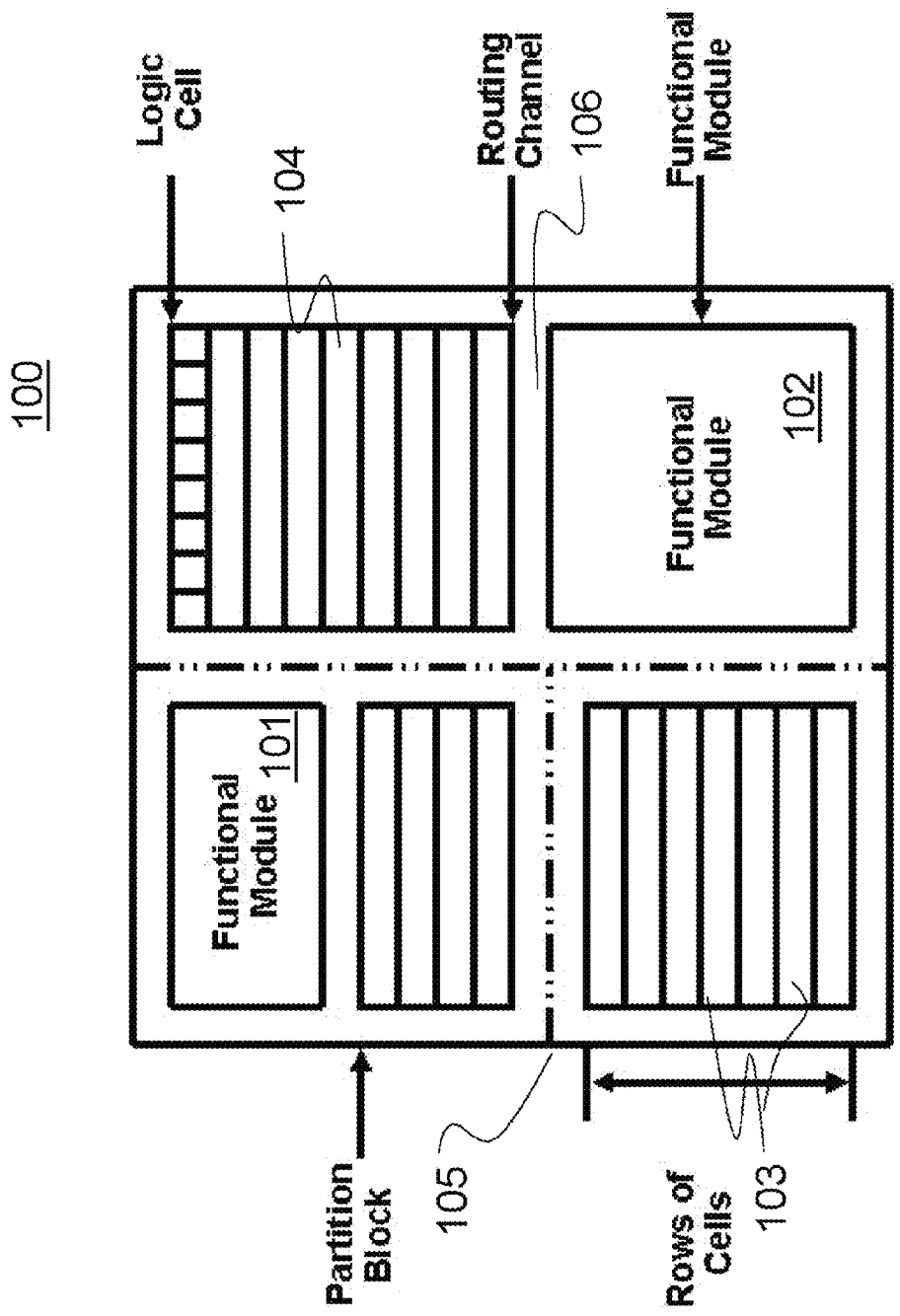
FIG. 1 illustrates in a simple block diagram the major blocks of an SOC or ASIC integrated circuit.
Figure 2:
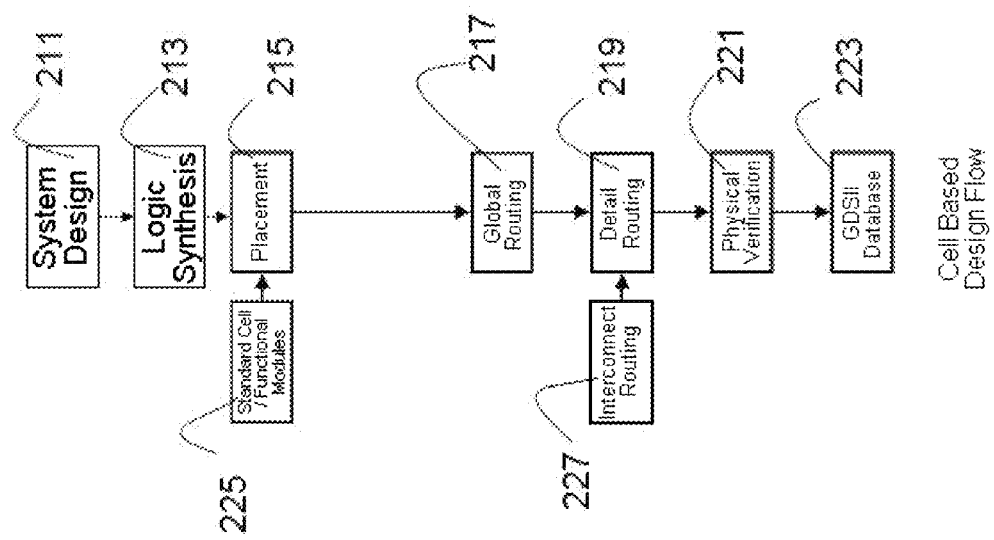
FIG. 2 illustrates in a flow diagram the steps of a design flow for an ASIC or SOC device of the prior art.
Figure 3:
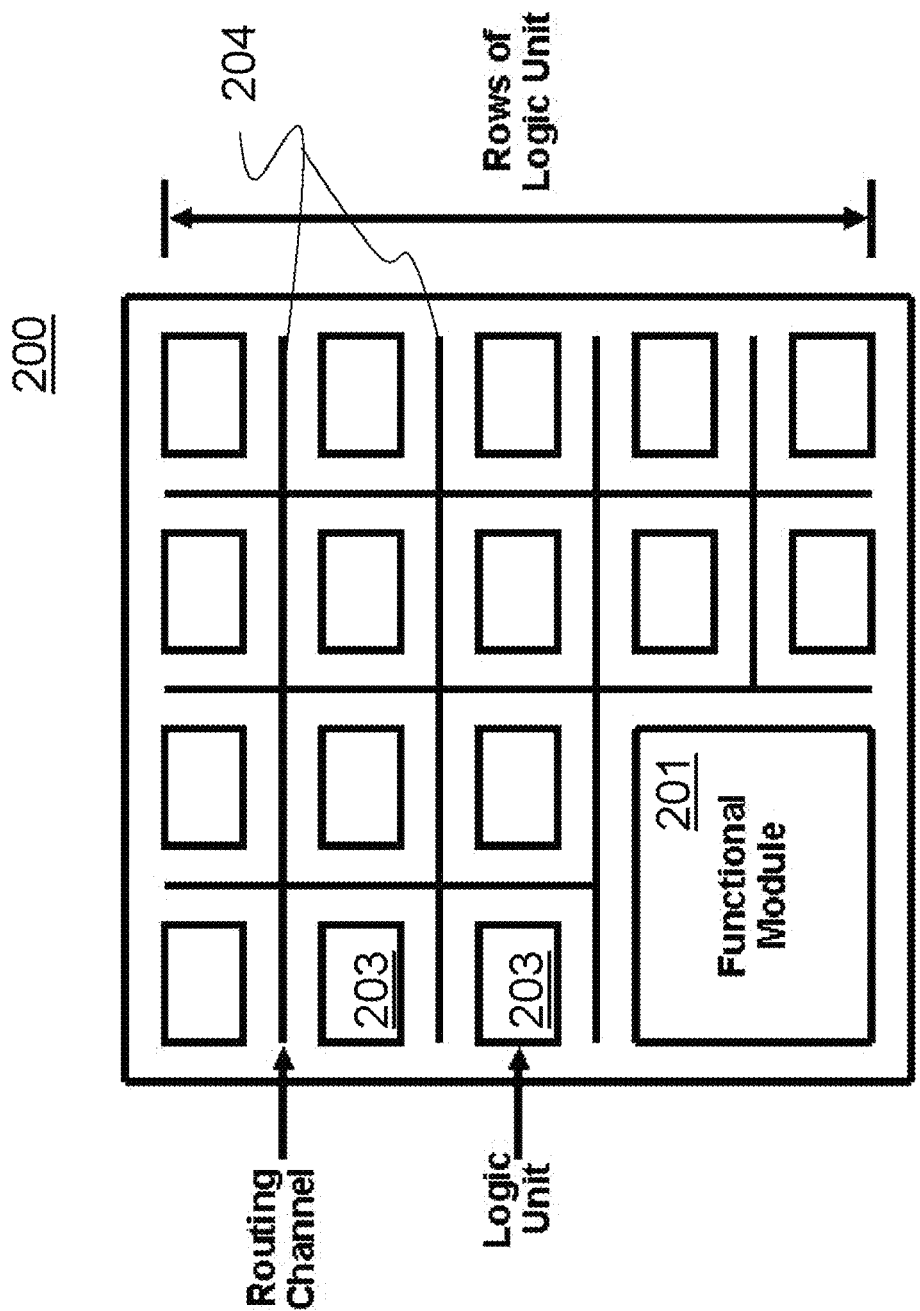
FIG. 3 illustrates in simple block diagram the major blocks of a prior art FPGA device.
Figure 4:
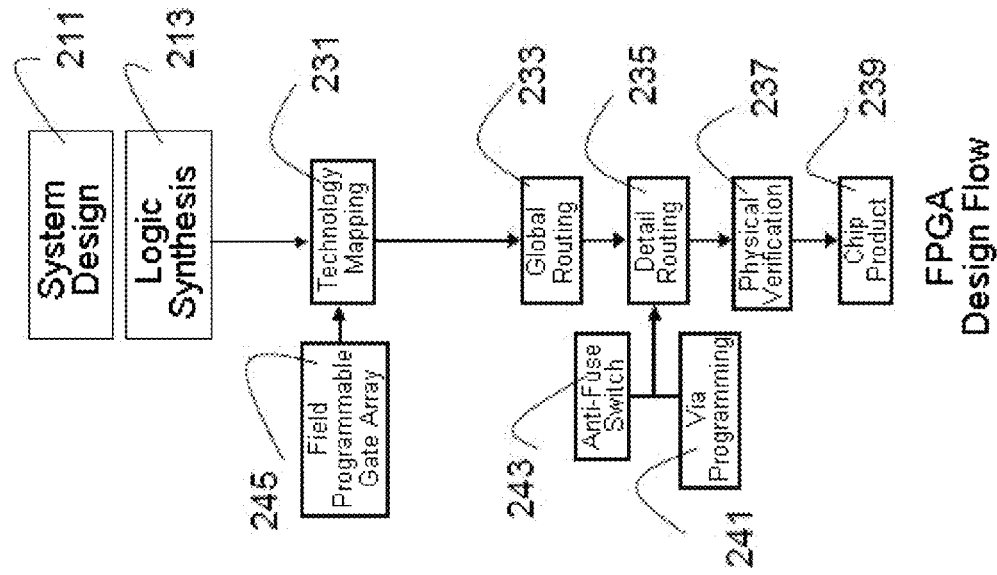
FIG. 4 illustrates in a flow diagram the steps of a prior art design flow for an FPGA device.
Figure 5:
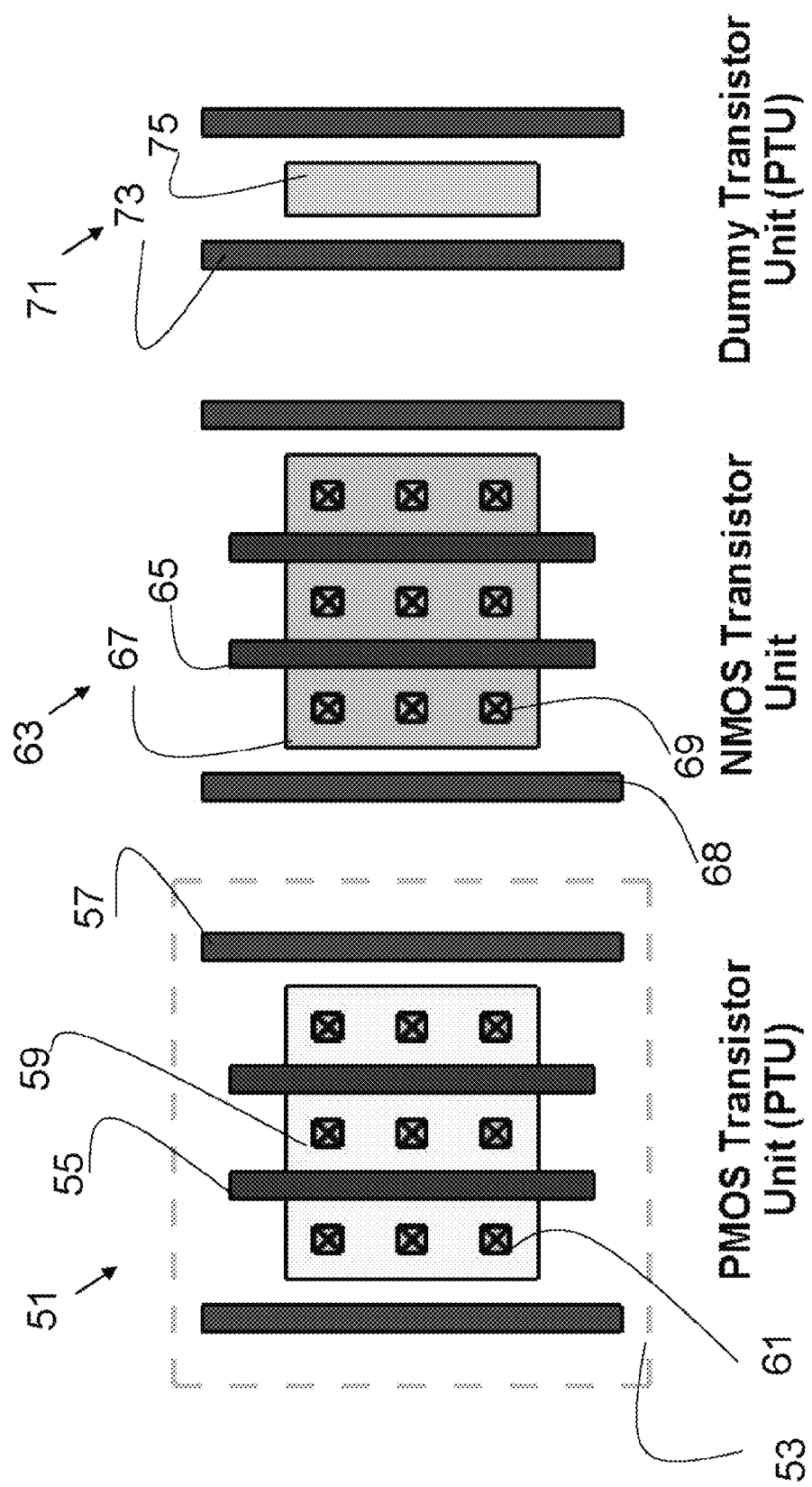
FIG. 5a illustrates in a plan view PMOS transistor units of exemplary embodiments of the present invention.
FIG. 5b illustrates in a plan view NMOS transistor units of exemplary embodiments of the present invention.
FIG. 5c illustrates in a plan view dummy transistor units of exemplary embodiments of the present invention.

FIG. 5a depicts in a plan view the layout diagrams for three embodiments of transistor units of the invention. In FIG. 5a, a PMOS transistor unit 51 is shown having a dashed boundary line indicating the n-well 53 needed in implementing P-MOS transistors in a p-type semiconductor substrate, Within the n-well 53 are shown floating gate conductors 55 and two dummy conductors 57 located beside the oxide dimension (OD) region 59, the gate dielectric material. Contacts 61 are shown to contact the diffused source and drain P regions between the gate conductors 55. The gate conductors may be of polysilicon, for example, other conductive materials may be used however. Although not visible, a plurality of gate contacts may be used to reduce resistance in connecting the floating gates to higher level conductors. The dummy conductors 57 may be of the same material as the gate conductors, typically polysilicon. The floating gate conductors 55 then allow for the formation of two transistors, while the dummy conductors 57 provide through cell routing to connect through the cell on the poly level without forming transistors.

Restricted design rules (RDR) are used in implementing the programmable transistor array and the basic transistor units (BTUs). By using RDRs, process variation sensitivity of the completed device is improved. For example, the polysilicon layer may be restricted to run in only one direction as shown. The area needed for the PMOS transistor unit (PTU) may be restricted to be greater in the X direction than in the Y direction, to further enhance the PMOS transistor performance. The arrangement of the PTU and NTU transistor units with respect to each other is also restricted as further described below.

NMOS transistor unit NTU 63 is illustrated in FIG. 5b. Because the semiconductor substrate is typically of P type material, no P type well is depicted for the NTU. However, in a dual well semiconductor process, a P well could be used as an alternative embodiment. The NMOS transistor unit has gate conductors 65 running over an N diffusion source/drain region 67 with contacts 69. Gate dielectric such as an oxide (not shown) lies under the gate conductors 65. Dummy conductors 68 form routing conductors to route through the NTU cell without forming transistors. Gate conductors and dummy conductors are typically polysilicon, although other conductors could be used. Gate dielectrics may include oxides such as silicon dioxide, nitrides, high and low-k dielectrics; typically silicon dioxide may be used.

FIG. 5c illustrates a dummy transistor unit, the third BTU provided in the embodiments. The dummy transistor unit 71 consists of dummy conductors 73 on either side of an OD area 75. The dummy conductors provide additional routing resources. The OD area is optimal for density. The polysilicon pitch distance is uniform through the three BTU cells, again the use of RDRs decreases process variation problems.

The use of RDRs continues as the BTUs are combined to form areas of the programmable transistor array. The restrictions may include requirements that the PTUs are placed alongside other PTUs or a dummy transistor unit, but they may have an NTU above or below the PTU. Similarly, the NTUs may be placed alongside only NTUs or a dummy transistor unit, but may have PTUs placed above or below them. PTUs may be placed above or below PTUs and NTUs may be placed above or below other NTUs.

Figure 6:
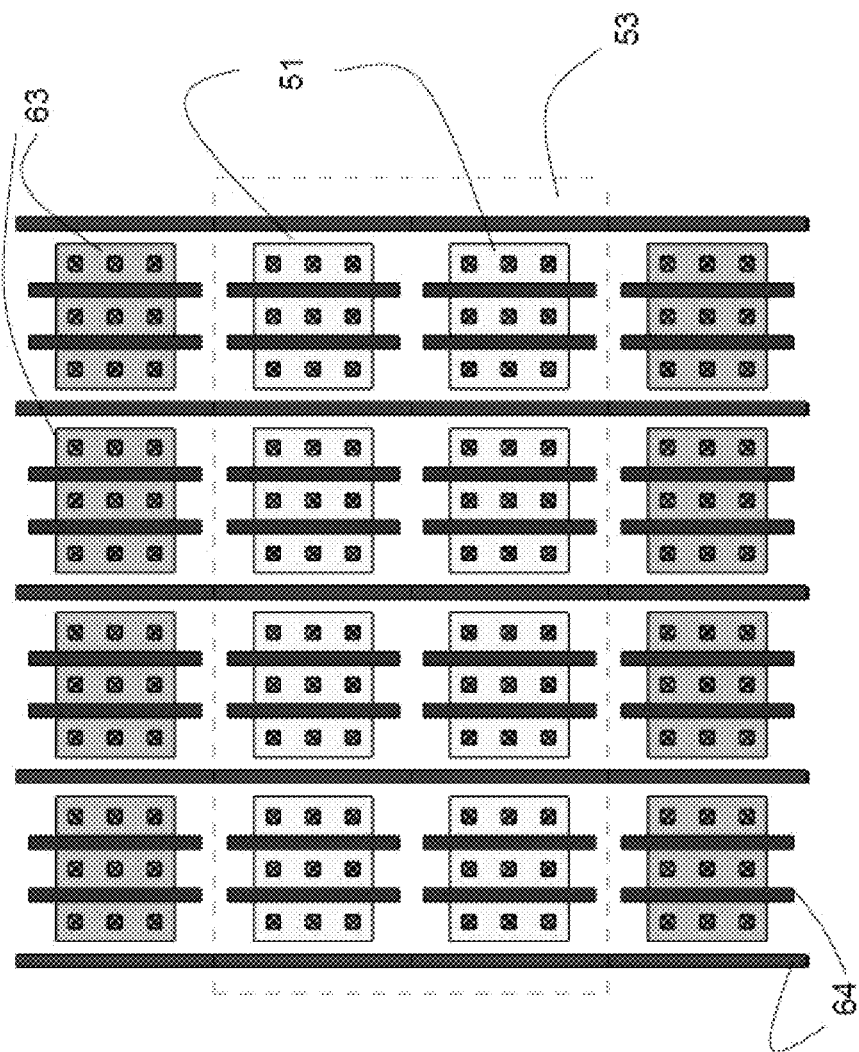
FIG. 6 illustrates in a plan view another exemplary embodiment of a circuit layout comprised of the transistor units of FIGS. 5a, 5b and 5c.

FIG. 6 depicts a plurality of PTUs 51 and NTUs 63 arranged in a standard CMOS layout arrangement. Conductors 64 which result from the dummy conductors running through the BTUs as the BTUs are combined together form routing resources for through signals in the polysilicon level, adding flexibility and allowing the BTUs to be combined into higher level functions with good density. The use of the RDRs keep the NTUs grouped together so a common N well 53 is used, also providing good layout density and easier processing.

Figure 7:
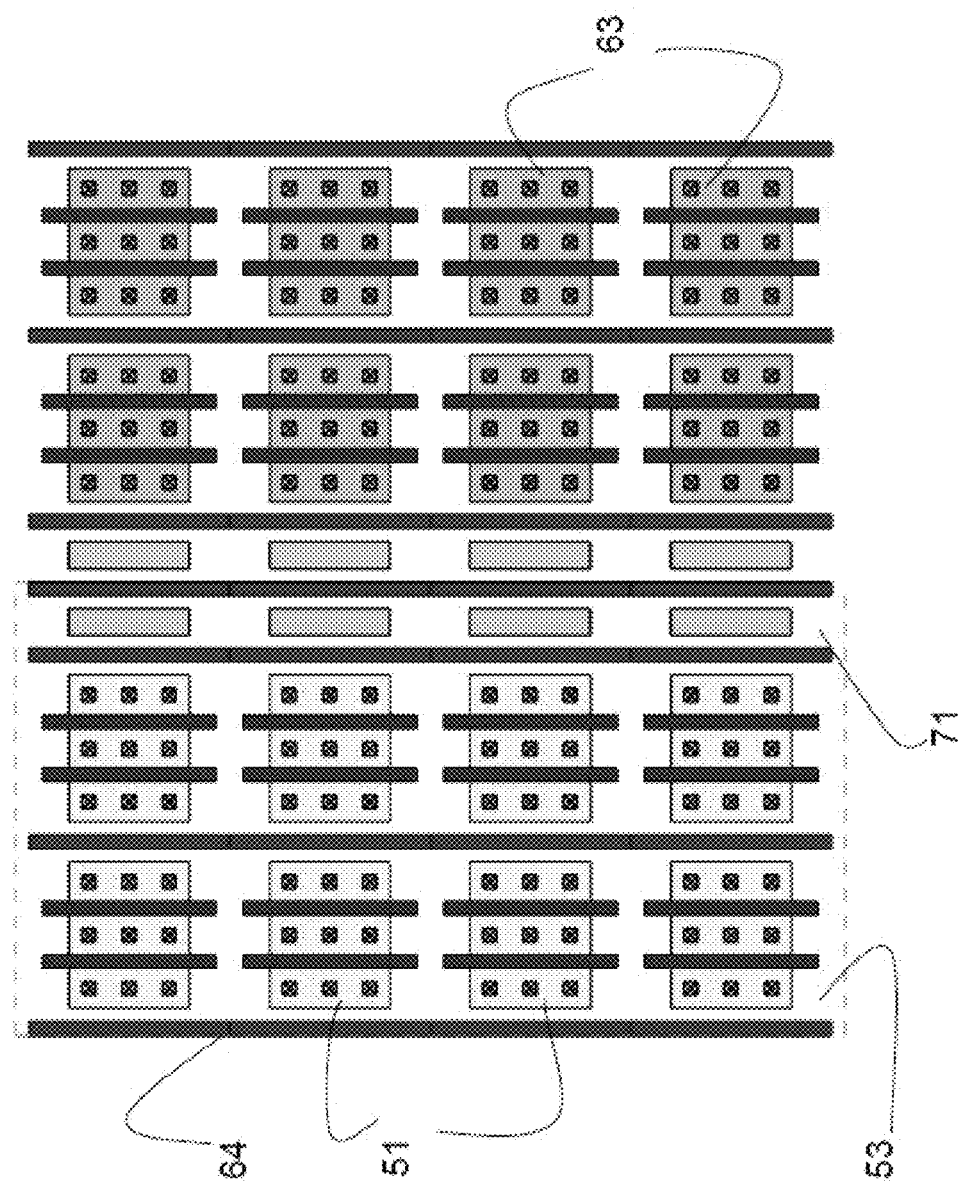
FIG. 7 illustrates in a plan view another exemplary embodiment of a circuit layout using the transistor units of FIGS. 5a, 5b and 5c.

FIG. 7 depicts an alternative arrangement for the BTUs to form a portion of a PTA device. In FIG. 7 the so-called parallel form is used. In FIG. 7 the PTUs are arranged on one side of the area, and following the RDR approach, the PTUs are separated from the NTUs by dummy transistor units. As in FIG. 6, the PTUs are arranged together and so can share a common N well 53. The dummy conductors in each NTU, PTU or DTU form vertical routing resources in polysilicon. Because routing can be done in polysilicon, the BTUs of the exemplary embodiment provide good routing choices and good layout density. Metallization layers especially metal one and metal two layers may be used to form logical units, and these may be combined to form higher order functions, as before.

The PTAs of FIG. 6 or 7, as non limiting exemplary arrangements, may be formed starting with a semiconductor substrate or silicon on insulator layer after the design process is complete. Alternatively, a base PTA wafer could be manufactured up through the polysilicon level by placing BTUs in a conveniently arranged array and completing the PTA device up to the polysilicon level. Once a particular circuit design is completed, then first and second metallization layers may be used to form logical units from the BTUs, and higher level functions such as adders, shifters and the like can be formed from the logical units (LTUs). Due to the flexibility of the manufacturing approach of the PTA embodiments, different circuit designs may be formed without changing the base material, simply by using different metallization patterns to configure the BTUs into different LTUs and then into higher level functional units. Since the global and detailed routing of the overall device is not done in advance, the overall routing is totally flexible, in contrast to the FPGAs of the prior art.

Note the metallization layers used in this description could be formed of aluminum and its alloys, copper and its alloys, or other conductive materials as known in the semiconductor art. The metal layers may be separated by any type of dielectric including complex multiple layer dielectrics, barrier layers and anti-reflective coatings may be used, and vias or plugs may be used to make vertical interconnections. Although not required, many levels of metal may be used overlying the first and second layers to route signals.

Figure 8:
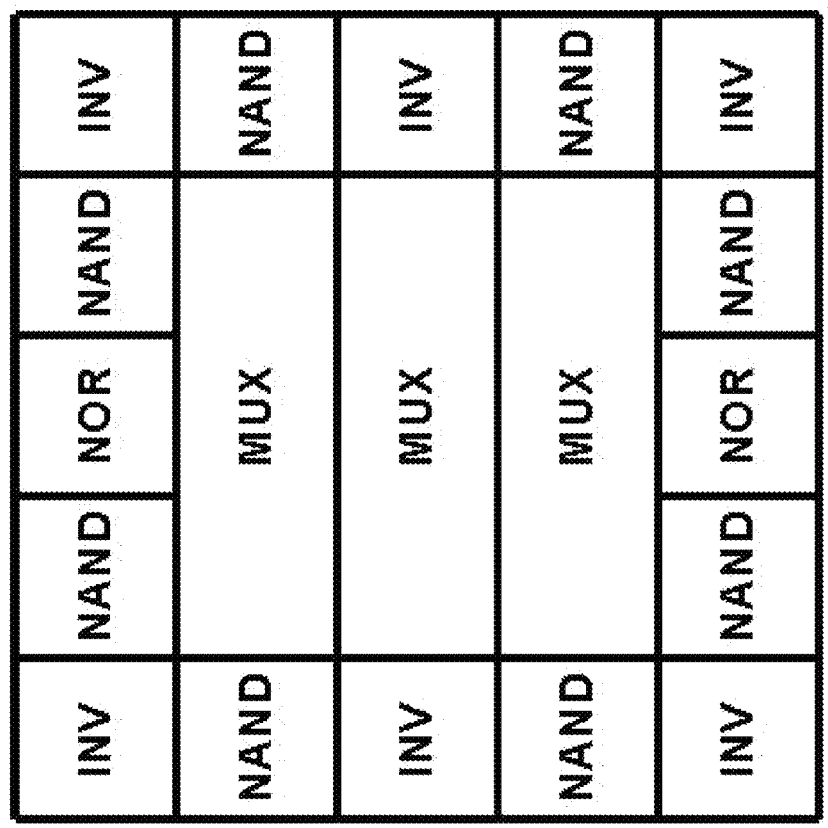
FIG. 8 depicts a logical unit of an exemplary embodiment.

FIG. 8 illustrates in one exemplary embodiment an LTU formed of a plurality of BTUs. The LTU may include various logic functions that are formed using first level metallization and the PTU and NTUs. Inverters, NAND, NOR, and one or several multiplexer functions are depicted as example functions. The second level metal may be used to combine these basic logic operations into XOR, XNOR, adders, latches and other more complex functions. The use of the first level of metallization to form basic LTU operations may be referred to as LTU functionality placement. The use of the second level of metallization to form complex logic operations may be referred to as LTU functionality routing.

The LTU arrangement of FIG. 8 is quite flexible. All of the blocks could have been logical blocks, that is, the multiplexers could be omitted and that area of BTUs could be used otherwise. The use of the BTUs with the first level of metal to determine the basic circuits of the LTU means that a wide variety of basic elements can be formed and LTUs can be arranged in many different ways. Also, and in contrast to the prior art FPGAs for example, the BTUs may be used to form analog circuits, high strength driver transistors (by coupling them in parallel) and other circuit elements without restriction. This allows the LUTs to form mixed signal circuits such as analog to digital converters and the like, in addition to digital logic circuits as shown in FIG. 8.

Figure 9:
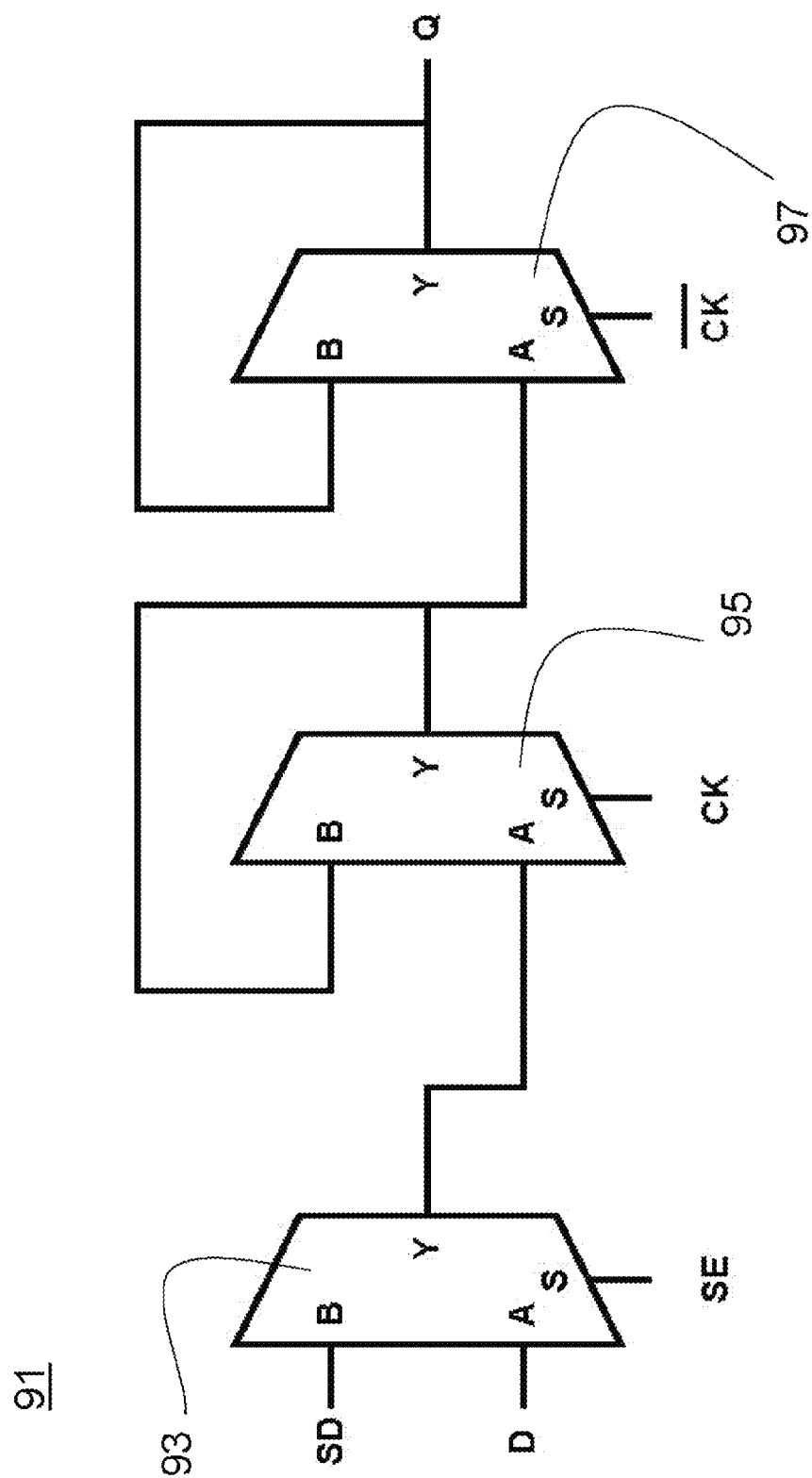
FIG. 9 depicts a synchronous element of an exemplary embodiment.

FIG. 9 depicts the use of the multiplexers of LTU 81 in FIG. 8, or other multiplexers, to form a more complex function, in this non-limiting example, a scan latch 91. Multiplexer 93 receives data on the D input and scan data on the SE input, and selects the input data source responsive to control signal SE. Multiplexer 95 receives the clock signal and when the latch is open, for instance when the clock CK is high, selects an input from the input multiplexer 93. Otherwise the first latch multiplexer 95 retains the state value by recirculating the output node through input B. Similarly the output multiplexer 97 receives the inverted clock CK_ and, depending on the value of the clock signal, retains the data on the Q output or allows Q to change. Thus, the LTU of FIG. 8 can easily be configured with second level metallization to form clocked registers, shifters, adders, multipliers or other functions.

Figure 10:
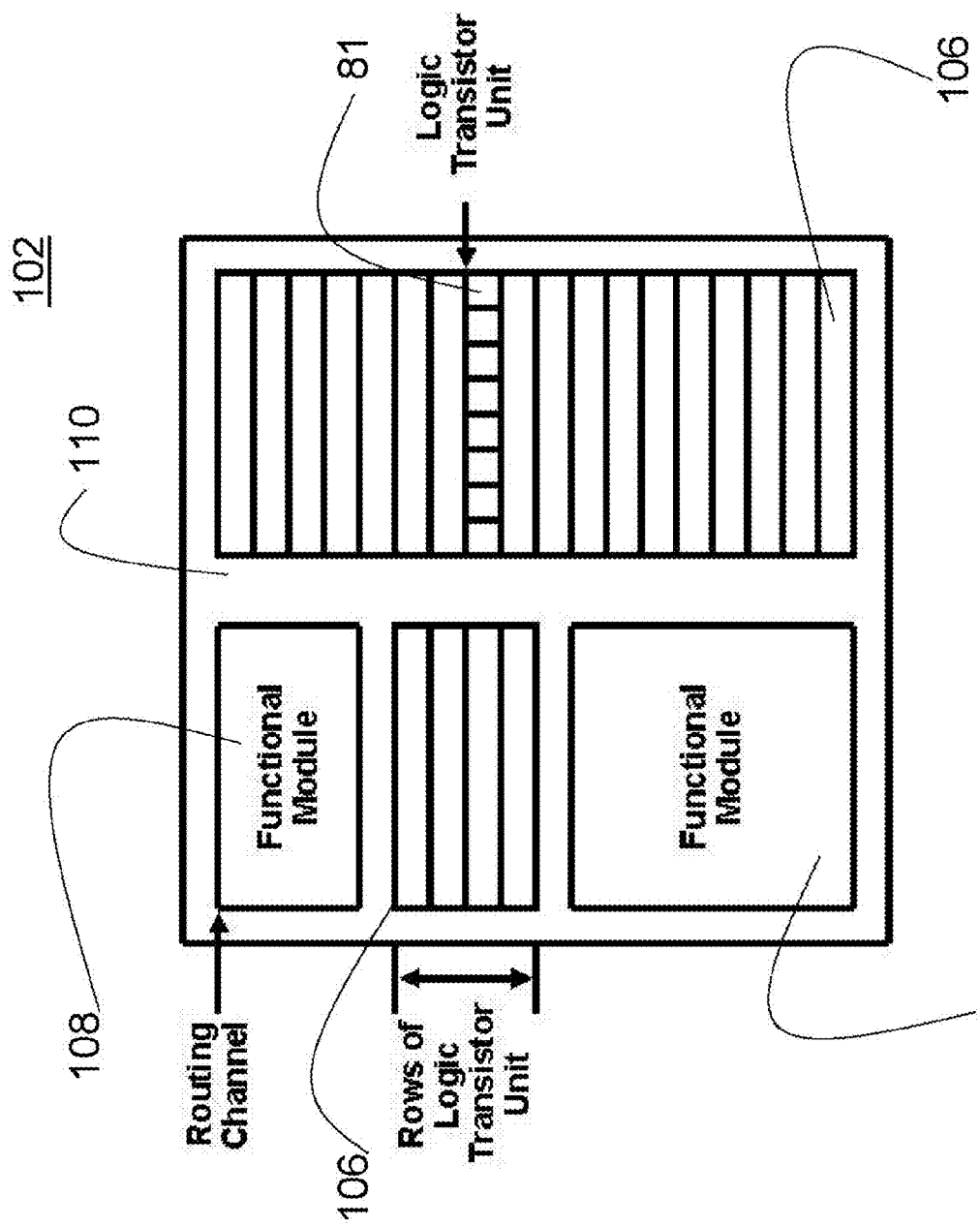
FIG. 10 depicts in a block diagram view the major blocks of an exemplary programmed transistor array embodiment.

FIG. 10 depicts, as one example embodiment, a block diagram of a PTA integrated circuit 102 produced using the LTUs and BTU embodiments described above. LTUs 81 are arranged in a plurality of rows 106 in arrays and subarrays, as is convenient. Many thousands, or even millions, of CMOS devices including the NTUs, PTUs, and DTUs of the embodiments above may be provided. Routing channels 110 remain available for completing the design. Embedded modules 108 are shown and may be any available functional module, such as a RISC or DSP or microprocessor, non volatile or volatile memory, SRAM, flash, EEPROM or the like may be provided as embedded modules. Again, the LTUs 81 may be functionally placed into basic logic elements using the first level of metal (and the polysilicon routing available inside the BTUs) and functionally routed into more complex elements using the second level of metal routing. The remaining interconnect can be performed with these metal layers, or if necessary higher levels of metal layers and interlevel dielectric layers with vertical vias can be formed as known in the art. The completed PTA devices can then be processed as a semiconductor wafer, singulated, packaged and tested.

Figure 11:
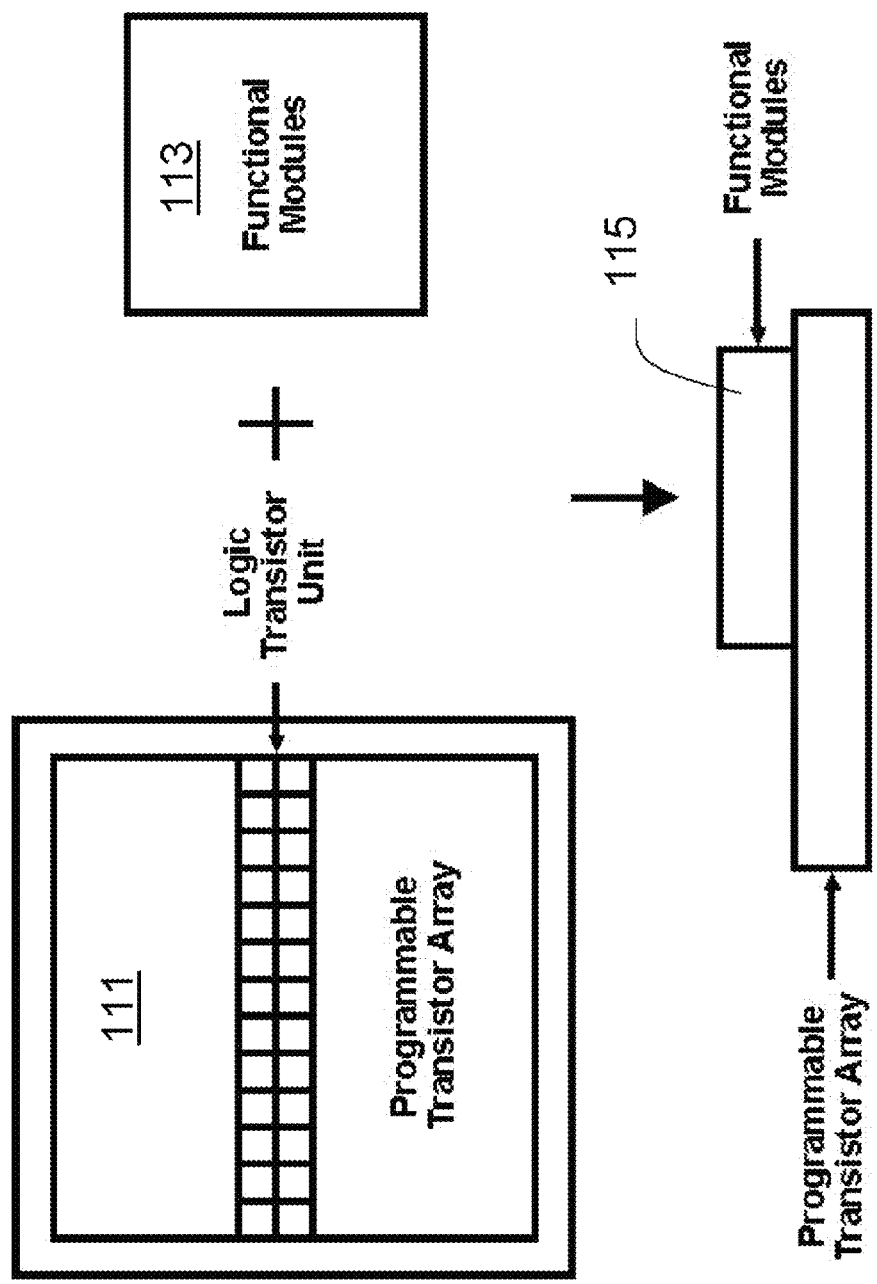
FIG. 11 depicts in an illustration the combination of an exemplary programmed transistor array embodiment with a functional module die.

FIG. 11 depicts an alternative embodiment for including embedded functions in a device but external to the PTA. In FIG. 11, a PTA 111 is shown as before consisting of LTUs which are then functionally placed into basic logic elements, using the metal one metallization, and functionally routed into higher level logic or storage elements, using the metal two metallization, as described above. A separate external device 113, such as another integrated circuit die, is then provided. FIG. 11 then depicts a completed device that couples the finished PTA with the external device in a stacked arrangement 115, for example.

This external embedded module embodiment has advantages in that known good die devices (KGDs) such as memory dies, processor dies, flash and the like devices can be provided with the PTA; without the need for embedding the function into the PTA. Because these external modules are already verified and tested, costs savings in design and verification, and manufacturing costs, may be lower for the PTA. Stacked die arrangements including through silicon via (TSV) and flip chip packaging may be used. Packages of a completed PTA and another device may be combined as stacked packaged devices using BGA, solder column and other multiple chip module (MCM) packaging technologies.

Figure 12:
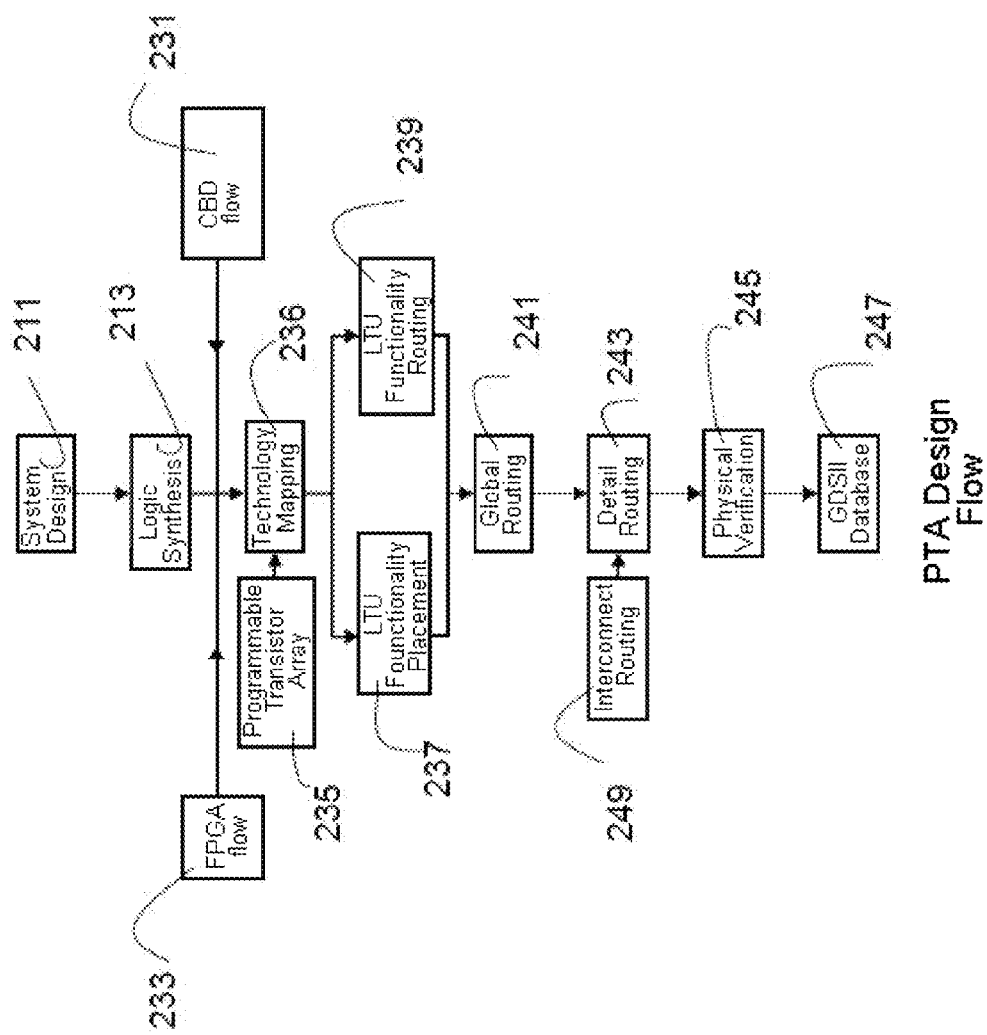
FIG. 12 depicts in a flow diagram an exemplary design flow for use with the various exemplary embodiments.

FIG. 12 depicts, in a flow diagram, an exemplary design flow that can be utilized with the programmable transistor array embodiments of the present invention. System design and synthesis steps 211, 213 are used as before as one entry point into the design flow for the PTA. Design step 211 involves forming a VHDL or behavioral level model of the functions the device is to perform. Logic synthesis produces a corresponding RTL level model that provides the correct functionality. This may be a technology independent model as before.

There are also at least two other possible entry points into the design flow depicted in FIG. 12. Entry point 233 allows an entry from an FPGA design flow. In one embodiment, the user can provide the output of the logic synthesis form the FPGA flow to the PTA design flow. Entry point 231 allows a cell based design user to provide the output of the logic synthesis to the PTA design flow. In this manner, existing designs may be reused, and also existing EDA tools which a user may be more familiar with may be used to provide an entry point into the PTA design flow.

In the technology, mapping step 236, the technology independent RTL or logic level model is transformed into a netlist based on the BTUs and LTUs of the PTA. In one embodiment, the PTA design flow resembles a cell based design flow in that the placement of the NTUs and PTUs is left random, that is, the design starts with no preconceived placement of the cells. In another exemplary embodiment that more closely resembles the FPGA design flow, a predefined arrangement of the BTUs in LTU cells arranged in rows or arrays may be provided. The PTA approaches of the embodiments are flexible in that either of these design approaches may be used.

In steps 237 and 239, the output of the technology mapping step is transformed into the LTU functionality placement information, which provides the first level metallization patterns and contacts to configure the LTUs into basic logic elements, and the LTU functionality routing, which provides the second level metallization patterns and vias to configure the basic elements of the LTUs into higher level elements that appear in the netlist.

The remaining steps are similar to the design flows described above. In step 241 global routing of the power, clock, ground, and similar lines is performed. In step 243, detail routing and in step 249, interconnect routing is performed. Once the routing of the design is complete, physical verification of the layout model is performed at step 245. Finally, a database for generating photomasks for the metal one, and higher layers, is produced at step 247.

Note that because the BTUs are already known, it is not necessary to produce photomasks for the diffusion, oxide, and polysilicon levels. These form the base material of the PTA and a wide variety of completed designs may be produced without changing these levels, so the masks for these levels are not needed for each unique design. Further for predefined placement embodiments, the base material may even be manufactured as wafers up through the polysilicon level in advance, shortening the manufacturing time for the completed devices still further.

The PTA design flow method embodiments of the present invention provide a design solution referred to as the Open Innovation Platform. By providing multiple entry points for a user to design an integrated circuit using the PTA embodiments, the OIP offers an integrated solution. The user can select various hardware and software options and perform an integrated circuit design using EDA tools for design implementation and verification. Since the PTA is already verified for the process used, and embedded modules that are also already verified may be provided, the time for verification is reduced. Because the embodiments of the PTA use restricted design rules such as one direction polysilicon, uniform polysilicon pitch, and restricted PMOS and NMOS placements, process variation sensitivity is greatly reduced. Because the routing remains flexible during the design process, design for process variation (DFP) and design for voltage (DFV) techniques may be integrated into the design flow. Using embodiments where external finished modules such as processors and memories are combined with a PTA circuit in a stacked die or multichip package further reduces production costs and design time. A predefined layout PTA array may be used, similar to an FPGA design approach, to further reduce manufacturing costs and time. By reducing the number of unique masks required, the costs for masks is greatly reduced over the prior art CBD approach. A unified package and test solution may be provided so that unique test sets and test heads are not required, further reducing manufacturing costs and manufacturing time.

Although the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A programmable transistor array, comprising:
   a semiconductor substrate; and
   a plurality of basic transistor units (BTUs) arranged in rows and columns of uniformly spaced cells, the BTUs further comprising PMOS transistor units (PTUs), NMOS transistor units (NTUs) and dummy transistor units (DTUs) each BTU having conductors arranged in a single direction running through the BTUs and the conductors being uniformly spaced with respect to each other;
   wherein an arrangement of the BTUs is subject to restricted design rules such that the NTUs are adjacent to other NTUs and DTUs but not PTUs across the rows, and the PTUs are adjacent to other PTUs and DTUs but not DTUs across the rows.

2. The programmable transistor array of claim 1, wherein the NTUS and PTUs further comprise:
   at least two gate conductors running the single direction and overlying a source/drain diffusion region to form source/drain areas adjacent the gate conductors;

gate dielectric material lying between the gate conductors and the semiconductor substrate;
source/drain contacts for coupling the source drain regions to other circuit elements using a first level of metal; and
gate contacts for coupling the gate conductors to other circuit elements using the first level of metal.

3. The programmable transistor array of claim 2 wherein the conductors and the gate conductors are polysilicon.

4. The programmable transistor array of claim 2, and further comprising:
a first level of metal coupling the BTUs together to form logical transistor units (LTUs) comprised of CMOS circuits.

5. The programmable transistor array of claim 4 wherein the LTUs can form basic circuit elements selected from a group consisting essentially of NAND, NOR, inverter, AND, OR, and multiplexer elements.

6. The programmable transistor array of claim 5 and further comprising:
a second level of metal overlying the first level of metal and spaced from it by a dielectric layer; and
vias extending through the dielectric layer and coupling portions of the first level of metal and the second level of metal to form complex logical circuits in the LTUs by coupling certain basic circuit elements together;
wherein the complex logical circuits can comprise one selected from a group consisting essentially of registers, latches, adders, multipliers, shifters, delay lines, XOR, XNOR, and buffer circuits.

7. The programmable transistor array of claim 1 wherein the DTUs further comprise:
a pair of polysilicon conductors arranged in the first direction and spaced apart opposing an oxide dimension area.

8. The programmable transistor array of claim 1 wherein the rows are arranged in a horizontal direction, the columns are arranged in a vertical direction, and the conductors in the single direction are in the vertical direction.

9. The programmable transistor array of claim 8 wherein the conductors in the BTUs extend vertically such that when arranged in rows, the conductors form continuous conductors in the vertical direction along the columns.

10. An apparatus, comprising:
a semiconductor substrate;
a functional module formed on the semiconductor substrate; and
a programmable transistor array formed on the semiconductor substrate, comprising a plurality of basic transistor units (BTUs) arranged in rows and columns of uniformly spaced cells, the BTUs further comprising PMOS transistor units (PTUs), NMOS transistor units (NTUs) and dummy transistor units (DTUs) each BTU having conductors arranged in a single direction running through the BTUs and the conductors being uniformly spaced with respect to each other;
wherein an arrangement of the BTUs is subject to restricted design rules such that the NTUs are adjacent to other NTUs and DTUs but not PTUs across the rows, and the PTUs are adjacent to other PTUs and DTUs but not DTUs across the rows.

11. The apparatus of claim 10, wherein the functional module further comprises one selected from a group consisting essentially of non-volatile memory and volatile memory.

12. The apparatus of claim 10, wherein the functional module comprises one selected from a group consisting essentially of a microprocessor, a digital signal processor, a reduced instruction set computer, and a central processing unit.

13. The apparatus of claim 10, wherein the functional module further comprises a first processor module and a second memory module coupled to the first processor module.

14. The apparatus of claim 10, wherein the NTUS and PTUs of the programmable transistor array further comprise:
at least two gate conductors running the single direction and overlying a source/drain diffusion region to form source/drain areas adjacent the gate conductors;
gate dielectric material lying between the gate conductors and the semiconductor substrate;
source/drain contacts for coupling the source drain regions to other circuit elements using a first level of metal; and
gate contacts for coupling the gate conductors to other circuit elements using the first level of metal.

15. The apparatus of claim 14, wherein the programmable transistor array further comprises
a first level of metal coupling the BTUs together to form logical transistor units (LTUs) comprised of CMOS circuits.

16. The apparatus of claim 15 wherein the LTUs can form basic circuit elements selected from the group of NAND, NOR, inverter, AND, OR, and multiplexer elements.

17. An apparatus, comprising:
a first integrated circuit comprising a programmable transistor array comprising:
a plurality of basic transistor units (BTUs) arranged in rows and columns of uniformly spaced cells, the BTUs further comprising PMOS transistor units (PTUs), NMOS transistor units (NTUs) and dummy transistor units (DTUs) each BTU having conductors arranged in a single direction running through the BTUs and the conductors being uniformly spaced with respect to each other;
wherein an arrangement of the BTUs is subject to restricted design rules such that the NTUs are adjacent to other NTUs and DTUs but not PTUs across the rows, and the PTUs are adjacent to other PTUs and DTUs but not DTUs across the rows; and
a second integrated circuit coupled to the first integrated circuit.

18. The apparatus of claim 17, wherein the first integrated circuit and the second integrated circuit form a multi-chip module.

19. The apparatus of claim 17, wherein the first integrated circuit and the second integrated circuit are packaged with one of the first integrated circuit and the second integrated circuit stacked on the other one of the first and second integrated circuits.

20. The apparatus of claim 17, wherein the second integrated circuit is one selected from a group consisting essentially of a processor integrated circuit and a memory integrated circuit.

* * * * *